(12) United States Patent
Colussi et al.

(10) Patent No.: US 9,048,232 B2
(45) Date of Patent: Jun. 2, 2015

(54) PACKAGE WITH INTEGRATED PRE-MATCH CIRCUIT AND HARMONIC SUPPRESSION

(75) Inventors: Laurentius Cornelis Colussi, Bilthoven (NL); Johannes Geradus Willms, Oosterhout (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 173 days.

(21) Appl. No.: 13/459,879

(22) Filed: Apr. 30, 2012

(65) Prior Publication Data
US 2013/0286620 A1 Oct. 31, 2013

(51) Int. Cl.
*H05K 7/00* (2006.01)
*H01L 23/498* (2006.01)
*H01L 23/552* (2006.01)
*H01L 23/66* (2006.01)
*H05K 1/02* (2006.01)
*H01L 23/00* (2006.01)
*H05K 1/11* (2006.01)
*H05K 1/16* (2006.01)

(52) U.S. Cl.
CPC ........ *H01L 23/49822* (2013.01); *H01L 23/552* (2013.01); *H01L 23/66* (2013.01); *H01L 24/06* (2013.01); *H01L 24/16* (2013.01); *H01L 24/45* (2013.01); *H01L 24/48* (2013.01); *H01L 2223/6655* (2013.01); *H01L 2223/6677* (2013.01); *H01L 2223/6688* (2013.01); *H01L 2224/0401* (2013.01); *H01L 2224/04042* (2013.01); *H01L 2224/06155* (2013.01); *H01L 2224/16225* (2013.01); *H01L 2224/45124* (2013.01); *H01L 2224/45144* (2013.01); *H01L 2224/45147* (2013.01); *H01L 2224/48227* (2013.01); *H01L 2224/48247* (2013.01); *H01L 2924/15311* (2013.01); *H01L 2924/19051* (2013.01); *H01L 2924/30105* (2013.01); *H01L 2924/30107* (2013.01); *H01L 2924/30111* (2013.01); *H01L 23/49827* (2013.01); *H01L 23/49838* (2013.01); *H05K 1/0251* (2013.01); *H05K 1/116* (2013.01); *H05K 1/162* (2013.01); *H05K 2201/09781* (2013.01); *H01L 2924/3011* (2013.01)

(58) Field of Classification Search
USPC .............. 361/783; 333/25, 32, 126, 204, 247; 343/895; 257/664
See application file for complete search history.

(56) References Cited

U.S. PATENT DOCUMENTS

| | | | | |
|---|---|---|---|---|
| 4,862,181 A | * | 8/1989 | Ponce de Leon et al. | .... 343/702 |
| 5,162,896 A | * | 11/1992 | Takubo et al. | ................ 257/664 |
| 5,231,361 A | * | 7/1993 | Smith et al. | ..................... 331/56 |
| 6,037,902 A | * | 3/2000 | Pinhas et al. | ........... 343/700 MS |
| 6,172,497 B1 | * | 1/2001 | Okumichi | ................ 324/754.06 |
| 6,215,377 B1 | * | 4/2001 | Douriet | ........................ 333/247 |

(Continued)

*Primary Examiner* — Xiaoliang Chen
(74) *Attorney, Agent, or Firm* — Saile Ackerman LLC; Stephen B. Ackerman; Rosemary L.S. Pike

(57) ABSTRACT

A package is connected at a first side to a printed circuit board and with a die fixed to it on a second side opposite to the first side. The package has an integrated pre-match circuit to provide an impedance match for a signal to be sent to a circuit external to the package. The signal has a predetermined main frequency component. The pre-match circuit has a pair of transmission lines and a pair of stubs on a predetermined layer of the package and connected to the pair of transmission lines. The pair of stubs have a length such as to form a short circuit for an harmonic frequency of the main frequency component in the signal.

10 Claims, 11 Drawing Sheets

(56) References Cited

U.S. PATENT DOCUMENTS

| | | | |
|---|---|---|---|
| 6,362,708 B1* | 3/2002 | Woods | 333/234 |
| 6,396,362 B1* | 5/2002 | Mourant et al. | 333/25 |
| 7,061,329 B2* | 6/2006 | Inoue et al. | 330/302 |
| 7,859,359 B2 | 12/2010 | Rofougaran | |
| 7,948,070 B2* | 5/2011 | Chuang et al. | 257/678 |
| 8,076,994 B2 | 12/2011 | Farrell et al. | |
| 2002/0130723 A1* | 9/2002 | Mikami et al. | 330/307 |
| 2004/0239446 A1* | 12/2004 | Gurvich et al. | 333/156 |
| 2005/0088363 A1* | 4/2005 | Grossman et al. | 343/895 |
| 2005/0151599 A1* | 7/2005 | Ido et al. | 333/133 |
| 2008/0116991 A1* | 5/2008 | Gagnon et al. | 333/32 |
| 2010/0060362 A1* | 3/2010 | Kanaya et al. | 330/306 |
| 2010/0060388 A1* | 3/2010 | Ueda | 333/236 |
| 2010/0301919 A1* | 12/2010 | Kakinuma et al. | 327/356 |
| 2010/0328186 A1* | 12/2010 | Kanno | 343/872 |
| 2011/0109403 A1* | 5/2011 | Gagnon et al. | 333/126 |
| 2012/0169431 A1* | 7/2012 | Kuroda et al. | 333/136 |
| 2012/0200368 A1* | 8/2012 | Gagnon et al. | 333/32 |
| 2013/0249652 A1* | 9/2013 | Pajovic | 333/204 |
| 2013/0267943 A1* | 10/2013 | Hancock | 606/33 |

* cited by examiner

PACKAGE WITH INTEGRATED PRE-MATCH CIRCUIT AND HARMONIC SUPPRESSION

TECHNICAL FIELD

The present disclosure relates to the field of integrated circuit packages and, more particularly, packages with integrated pre-match circuits.

BACKGROUND

The main function of an integrated circuit (IC) package is to protect, power, and cool an IC device within the package and provide thermal, electrical, and mechanical connections to properly interface with a larger system such as a Printed Circuit Board (PCB).

FIG. 1 shows an example of such an IC package. The area on the bottom side of FIG. 1 is a PCB 21. On top of the PCB 21, an IC package is provided which comprises a plurality of connection points 32, one or more ground structures 28 which connect the package to ground, a power supply 30 which provides power to the package, a plurality of transmission lines 34 and one or more vias 36 inside of the package. A die 24 connects to the IC package via a plurality of bond wires 26. The IC package provides a signal path 22 (the dotted line depicted in FIG. 1) from the die 24 to a receiver circuit mounted on another area of the PCB 21.

The signal path 22 comprises: 1) a bonding structure from the die 24 to the bond wires 26 that act as an interface between the die 24 and the package, 2) transmission lines 34 which are inside of the package and 3) vias 36 in the right-bottom part of the FIG. 1 that provide one or more vertical connections to one or more connection points 32.

Normally the process of manufacturing an IC package comprises four main procedures:
1) A wafer is separated into IC chips (dies) by a diamond saw; normally this step is called a die separation step.
2) The separated die is bonded into the center of a lead frame or package; normally this step is called a die attachment step.
3) The pads on the IC chip and adjoining terminals on the lead frame are connected, one-by-one, with gold, copper or aluminum wires; normally this step is called a wire bonding step.
4) The chip is sealed with a macro-molecule plastic, like epoxy resin, thus finishing the plastic package container. The lead frame is cut, and leads are bent thus forming the package. This procedure is commonly called "Glob Top" assembly or encapsulation.

During the die attachment step, two different technologies may be used: a) wire bond attachment, and b) flip-chip attachment. FIG. 2A describes the wire bond attachment and FIG. 2B describes the flip-chip attachment in more detail.

The wire bond method described by FIG. 2A is the most widely used method. The left side of FIG. 2A is a side view of the wire bond method, the right side of FIG. 2A is a top view of the wire bond method. The wire bond 26 is simply a very small wire with a diameter of about 0.0254 mm. The bond wire lengths vary from approximately 1.27 mm to 12.7 mm. The die 24 is mounted onto the package with a plurality of pads 46 on top. The bond wire 26 connects both the die 24 and a further pad 40 which is on the package. The advantage of the wire bond method is that it is inexpensive, mechanically simple, and allows for some changes in the bonding pad location and package routing. Furthermore, since the back of the die 24 is attached directly to the package substrate, it allows maximum surface area contact between the die and the package, which maximizes heat transfer out of the die 24.

The flip-chip attachment method described in FIG. 2B is another widely used method. The left side of FIG. 2B is a side view of the flip-chip attachment method and the right side of FIG. 2B is a bottom view of the flip-chip attachment method. The die 24 is mounted onto the package with a plurality of package bond pads 46 on the bottom. A plurality of small solder balls 42 are located on pads of the die 24 in order to make a connection between the die 24 and the substrate. The die 24 is then placed upside down on the package and the solder is reflowed to make an electrical connection to the package bond pads 46. Flip-chip technology is also said to be self-aligning because when the solder is re-flowed, the surface tension of solder balls will pull the die 24 into alignment with the bond pads 46 on the package. The main advantage of flip-chip attachment is that the inductance of a flip-chip connection is much lower than that of a wire bond.

During the assembly procedure, two assembly technologies are mainly used: 1) Pin-through-hole (PTH) packaging, and 2) surface mount technology (SMT) packaging. If the packages have pins that can be inserted into holes in the PCB, the technology is called through-hole packaging. If the packages are not inserted into the PCB, but are mounted on the surface of the PCB, the technique is called SMT. The advantage of the SMT, as compared to PTH, is that both sides of the PCB can be used, and therefore, higher packing density can be achieved on the PCB.

Normally, an IC package may comprise a plurality of 1) vias and 2) stubs:
1) A via is a small hole drilled through a PCB that is arranged to make connections between various layers of the PCB or connect components to one or more leads (57, 58) on a layer of the PCB. The most common type of via is called a through-hole via because it is made by drilling a hole through the board, filling it with solder, and making connections on appropriate layers via a pad. FIG. 3 shows the structure of a through-hole via. Normally a through-hole via comprises a barrel 50, one or more pads 52, and an antipad 56. As shown, the upper pad 52 connects to a lead 57 and antipad 56 connects to a lead 58 on a different layer.
2) A stub is a length of transmission line that is connected at one end only. The free end of the stub is either left open-circuited or short-circuited. Neglecting transmission line losses, the input impedance of the stub is purely reactive. Depending on the electrical length of the stub and on whether it is open or short circuit, the stub will perform either capacitively or inductively.

The interconnections in PCBs and in packages are generally considered as transmission lines. The transmission line can couple energy to adjacent signal lines, which results in crosstalk. Crosstalk can cause false switching of circuits and can increase delay times. Transmission lines account for a finite propagation velocity of electrical signals. The ratio of the voltage to the current carried by a wave in a particular direction on a transmission line is the characteristic impedance of the line. Discontinuities in the characteristic impedance cause partial reflections of the waves on the line. Reflections give rise to signals traveling the wrong way on an interconnect, which can be thought of as additional noise within the system. To prevent reflections, transmission lines must be properly terminated at their ends by "matching" the load impedance to the characteristic impedance of that line.

A balun circuit is a type of electrical transformer that converts signals that are balanced about ground to signals that are unbalanced and vice versa. The balun circuit is very often also used to change impedance. It can be simply considered as a transmission line transformer. In the area of the present disclosure, where a chip could be connected to an antenna in order to transmit signals as generated on the chip, such a balun circuit is quite often used to connect the transmission line, that is connected at one end to the chip at its other end, to the antenna.

If the chip is bonded in a standard package via soldering iron (wire bond attachment), the larger the length of the associated transmission line, the worse the performance of the chip at the outside of the package will be. To counter this effect, a pre-match circuit 72 can be used between the transmission line and the balun circuit 74 which is, at its other end, connected to antenna circuit 76, as shown in FIG. 4.

In the example of FIG. 5, the pre-match circuit 72 has two input lines connected to a differential output of the chip. One of the input lines is connected to ground via a capacitor 81. The other line is connected to ground via a capacitor 82. Both capacitors 81, 82 may have a value Cp. However, their values may be different. By doing so, the input lines to the pre-match circuit 72 may have a (very) low impedance whereas the output lines of the pre-match circuit 72 may have a (very) high impedance. Such a high impedance is easier to be dealt with by designers of balun circuits. The pre-match circuit 72 is located on the die 24 or on the PCB.

The balun circuit 74 has two input lines connected to two output lines of the pre-match circuit 72. One of the input lines is connected to ground via a capacitor 83 and to an output line via an inductor 84. The other line is connected to a power supply VBAT via an inductor 85 and to another output line via a capacitor 86. Both capacitors 83, 86 may have a value Cb. However, their values may be different. Both inductors 84, 85 may have a value Lb. However, their values may be different. The power supply VBAT is connected to ground via a capacitor 87 which may have a value Cd.

Both output lines are short circuited and connected to ground via a series circuit of an inductor 110 having a value Ls and a capacitor 89 having a value Cd. Moreover, the short circuited output is connected to a single-ended output to be connected to an antenna via a capacitor 88 having a value Cc. The junction of inductor 110 and capacitor 89 is connected to power supply VBAT.

Inductors 85 and 110 are used to connect DC power supply VBAT to the balun circuit. Capacitors 87 and 89 are used for decoupling. Capacitor 88 is a coupling capacitor to the antenna. Capacitor 88 is not involved in the matching function.

In general, the output of the chip is connected to the pre-match circuit 72 by means of a transmission line. However, the pre-match circuit 72 between the chip and the balun circuit 74 which connects to the antenna may not be close enough to the chip outputs. Due to this relatively long transmission line, the (very) low impedance at the chip output transforms to an impedance with a high quality (Q) factor. This makes the pre-match circuit 72 and balun circuit 74 more sensitive for component value variations of the various inductors and capacitors in these circuits.

To solve this pre-match circuit problem, one existing solution is called "Known Good Die" (KGB). In this solution, the package is entirely removed and the chip is assembled on the Printed Circuit Board (PCB) directly close to pre-match circuit 72. The disadvantage of the KGB solution is that this assembly technique is not supported by all manufacturers since many of them prefer packaged chips. Moreover, it is more difficult to test a chip without the package.

Another known solution is called "low-temperature co-fired ceramic" (LTCC): Here, the chip is assembled on a substrate which contains the pre-match circuit 72. Subsequently, the substrate is bonded on a PCB. The pre-match circuit can exist both as a planar structure on the assembled component and as a circuit incorporated on the substrate. The disadvantage of LTCC is that the cost is very high.

Pre-match circuits integrated in a package are, for instance, known from US2008/191362, US2004/178854, and U.S. Pat. No. 6,215,377. However, such pre-match circuits may suffer from transmission of radiation at higher harmonics of signals within the pre-match circuit.

SUMMARY

The object of the present disclosure is to provide a package with integrated pre-match circuit that solves the impedance matching problem between a package and printed circuit board (PCB). Moreover, an object is to solve problems relating to transmission of radiation relating to higher harmonics of signals within the pre-match circuit.

The object is solved by a package as defined in claim 1. By integrating the pre-match circuit in the package, the impedance matching can be realized close to the chip outputs, while still having the benefits of using a package. Moreover, by designing the first pair of stubs to have a length such as to substantially form a short circuit for at least one harmonic frequency of the main frequency component in the signal, this harmonic frequency will not give rise to external radiation.

Other aspects are claimed in other independent claims.

Advantageous embodiments are claimed in dependent claims.

BRIEF DESCRIPTION OF THE DRAWINGS

The following drawings are only intended to show embodiments of the present disclosure and not to limit the scope. The scope of the present disclosure is defined in the annexed claims and by its technical equivalents.

The drawings show.

DETAILED DESCRIPTION

Now it will be explained how, in the present disclosure, the problems discussed above are overcome by having the pre-match circuit implemented as an integrated impedance matching circuit inside the package.

Figure 6:
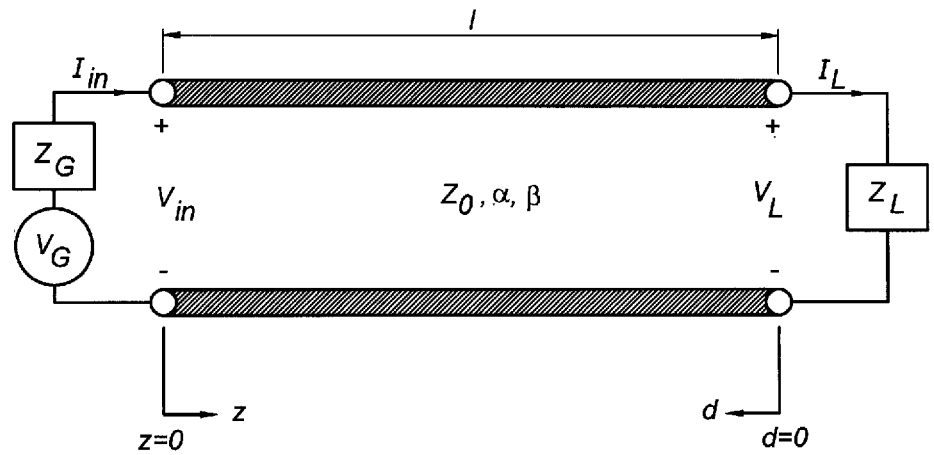
FIG. 6 shows a transmission line with arbitrary termination $Z_L$.

FIG. 6 shows a representation of a transmission line with a characteristic impedance $Z_O$, an attenuation constant $\alpha$ and a phase constant $\beta$. At its input side, the transmission line is connected to a voltage source $V_G$ having an internal impedance of $Z_G$. The distance z is the distance along the transmission line, starting from the voltage source $V_G$. The transmission line is terminated with a load impedance $Z_L$. A voltage across the load impedance $Z_L$ is indicated with $V_L$. The distance d is the distance along the transmission line, starting from the load impedance $Z_L$. The total length of the transmission line is 1.

It can be derived that the reflection coefficient at an arbitrary point d on the line is:

$$\Gamma = \Gamma_L e^{-2\gamma d} \quad (1)$$

With $$\Gamma_L = \frac{Z_L - Z_0}{Z_L + Z_0} \quad (2)$$

and $$\gamma = \alpha + j\beta \quad (3)$$

Since the reflection coefficient is related to the impedances $Z_O$ and $Z_L$ via equation (2), it is apparent that the impedance must also be a function of position:

$$Z = Z_0 \frac{1+\Gamma}{1-\Gamma} = Z_0 \frac{1 + \Gamma_L e^{-2\gamma d}}{1 - \Gamma_L e^{-2\gamma d}} \quad (4)$$

where Z represents the impedance at a certain point along the line at position d. Introducing equation (2) and making use of the following hyperbolic equation $$\tanh z \equiv \frac{\sinh z}{\cosh z} = \frac{e^z - e^{-z}}{e^z + e^{-z}} \quad (5)$$

equation (4) can be rewritten into the following relation:

$$Z = Z_0 \frac{Z_L + Z_0 \tanh \gamma d}{Z_0 + Z_L \tanh \gamma d}. \quad (6)$$

The input impedance is obtained by merely setting d=1.

In many practical situations, the line attenuation can be neglected and hence it is useful to write equation (6) for the lossless case. For $\alpha=0$, $\gamma d=j\beta d$ and tan-h $\gamma d$ becomes j tan $\beta d$. For a lossless line, equation (6) can be rewritten as follows:

$$Z = Z_0 \frac{Z_L + jZ_0\tan\beta d}{Z_0 + jZ_L\tan\gamma\beta d}. \quad (7)$$

In FIG. 6, a special case of the transmission line is the open-circuited line with $Z_L=8$. Introducing this information in equation (7) gives the input impedance of this open-circuited line:

$$Z_{in} = -jZ_O \cot \beta l \quad (8)$$

The input admittance is given by the following relation:

$$Y_{in} = \frac{1}{Z_{in}} = jB_{in} = jY_0 \tan \beta l \quad (9)$$

with $$Y_0 = \frac{1}{Z_0} \quad (10)$$

Figure 7:
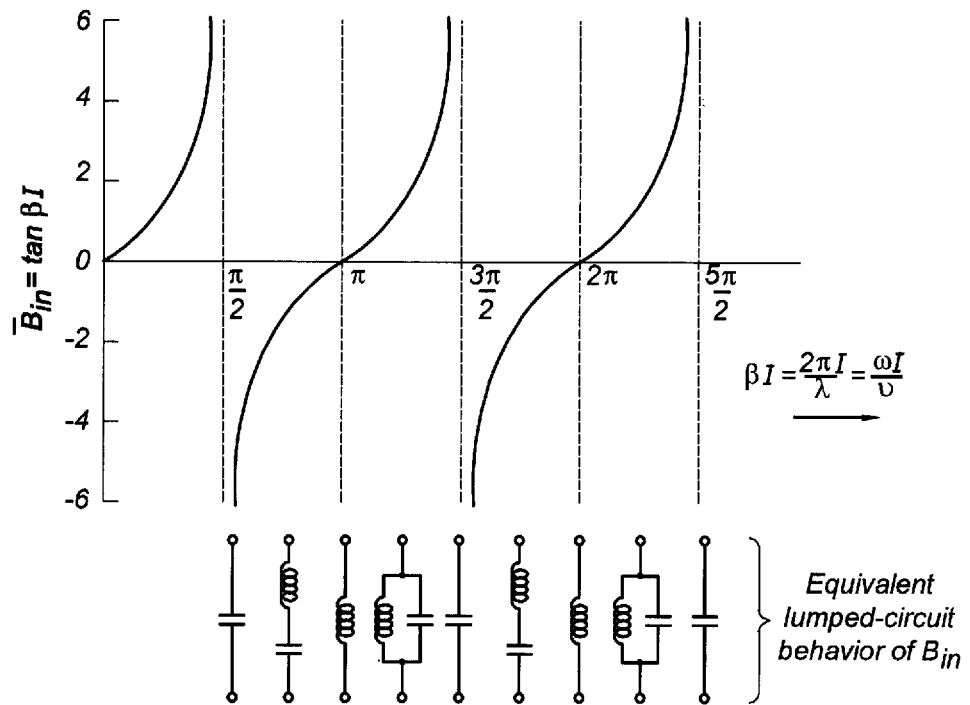
FIG. 7 shows a normalized input susceptance versus β1 for an open-circuited, lossless transmission line.

A plot of the normalized input susceptance tan $\beta$1 versus $\beta 1 = 2\pi 1/\lambda$ is the tangent function and is given in FIG. 7.

For $\beta 1 < \pi 2 (1 < \lambda/4)$, the input is capacitive since $B_{in}$ is positive. Thus $B_{in} = \omega C_{eq}$ and $$C_{eq} = \frac{Y_0}{\omega} \tan \beta l \quad \text{farads} \quad (11)$$

with $$\omega = 2\pi f \quad (12)$$

This capacitive behavior of the transmission line is used for the pre-matching at the DECT frequencies. When $\beta 1 = \pi/2$ (1=$\lambda$/4), $B_{in}$ equals $\infty$, which means that the input of the transmission line is shorted. This behaviour can be used to short the unwanted $2^{nd}$ harmonic signals that pass through the pre-matching circuit towards the balun circuit 74 on the external PCB.

In accordance with the present disclosure, by changing the properties of the transmission line ($Z_O$, length, shape, coupling with ground layers, etc), the transmission line(s) are configured in such a way that the required pre-matching capacitance together with the short at the $2^{nd}$ harmonic frequency is obtained. The transmission line(s) can even be used in combination with a ground layer that is not placed on the inside or outside of the package. In that case, the transmission lines can be placed on the outside of the package, while the ground layer on the PCB underneath the package acts as a ground layer for the transmission lines.

As is shown in FIG. 7, we can deduce the following equivalences:
1. At frequencies in the vicinity of $\beta 1=(2n-1)\lambda/2$ (an odd number of quarter wavelengths), the open-circuited line behaves like a short.
2. At frequencies in the vicinity of $\beta 1=n\lambda$ an integral number of half wavelengths), the open-circuited line behaves like an open.

By looking at FIG. 7 and taking into account point 2 as mentioned above, we can notice that the transmission line also behaves like a short at the $6^{th}$ harmonic frequency ($1=3\pi/2$). At the $4^{th}$ harmonic frequency ($\beta 1=\pi$), the input of the transmission line behaves like an open.

This is unwanted because this creates a sensitive node for any unwanted signals at the 4.sup.th harmonic frequency.

This behaviour of the transmission line can be extended for the other harmonic frequencies such as, for example, the 3.sup.rd ($\beta 1=3\pi/4$) and 5.sup.th ($\beta 1=5\pi/4$) harmonic. As can be seen in FIG. 7, the input impedance at these frequencies is neither a short nor an open. By adding multiple open-circuited or even short-circuited transmission lines to the already present transmission line, the behaviour of the 3.sup.rd and 5.sup.th harmonic can also be controlled. Also an additional open-circuited transmission line for the 4.sup.th harmonic can be added to compensate for the unwanted effect of the original transmission line ($\beta 1/=\pi$). An example of such a multiple open-circuited transmission line layout is explained with reference to FIG. 16 below.

Figure 5:
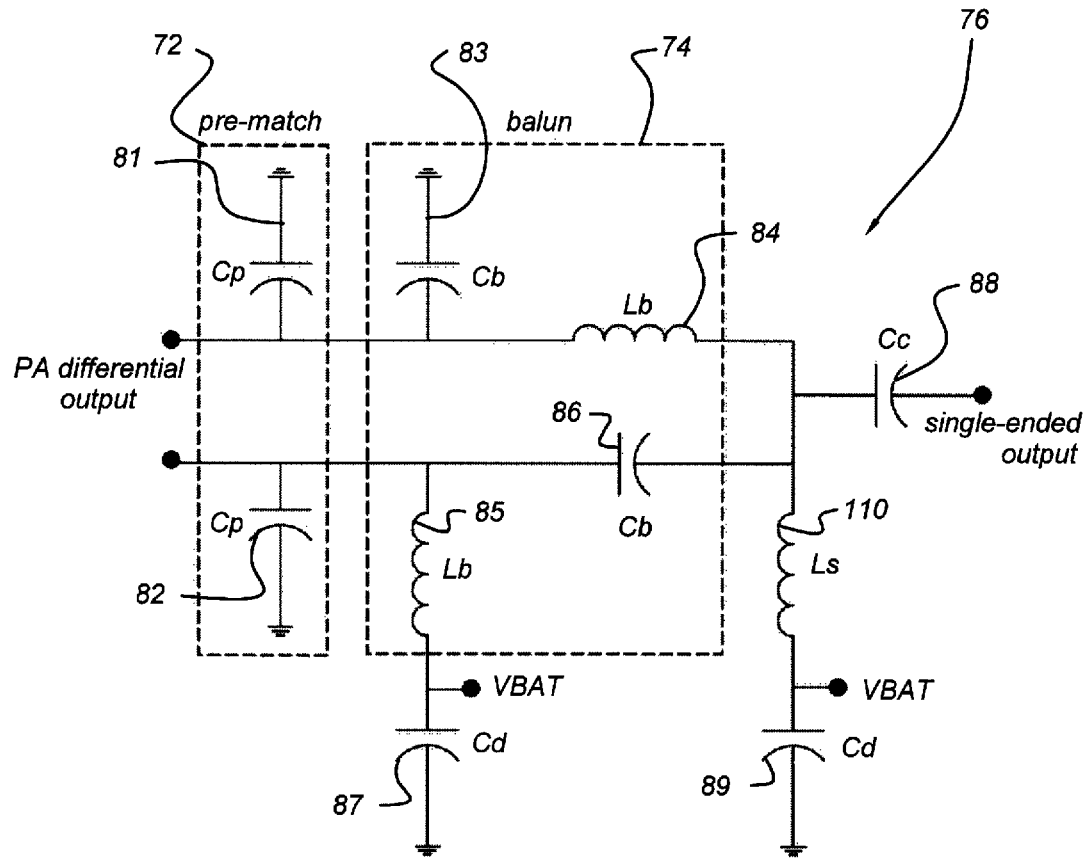
FIG. 5 shows an electrical diagram example of a pre-match circuit and balun circuit.

A first embodiment of the package relates to a substrate of four-layers and will be explained with reference to FIGS. 8 to 12. It is observed that the present disclosure is not restricted to substrates with four layers. This package may be manufactured by a Surface Mount Technology (SMT) or wire bond attachment technology. As a standard package, all four layers have the same dimension. As will be explained below, the four-layer package contains one or more stubs and a plurality of through-hole vias which together provide the same impedance as a pre-match circuit as shown in FIG. 5, i.e. the pre-match circuit is moved into the package. The balun circuit remains external (on the main PCB).

Figure 1:
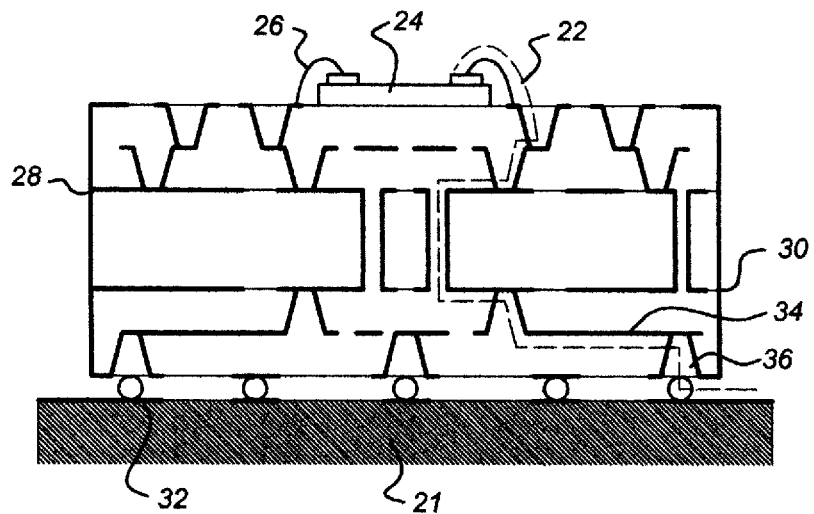
FIG. 1 shows some signal paths within an IC packaging.
Figure 2A:
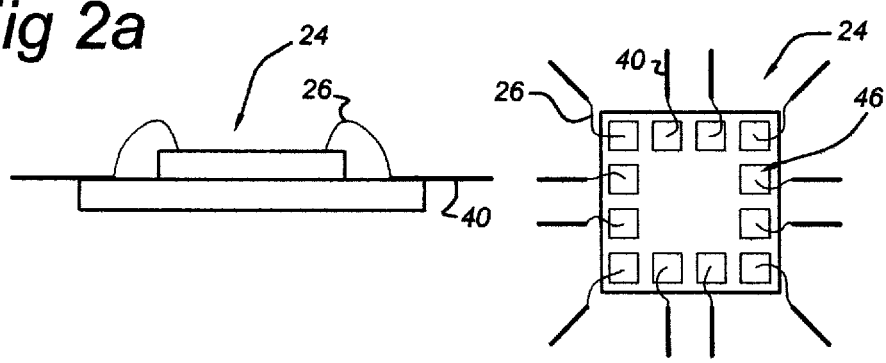
FIGS. 2A and 2B show a wire bond attachment technique and flip-chip attachment technique, respectively.
Figure 2B:
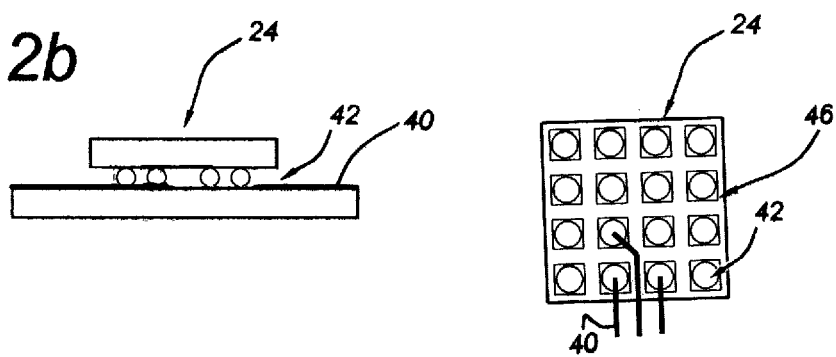
Figure 3:
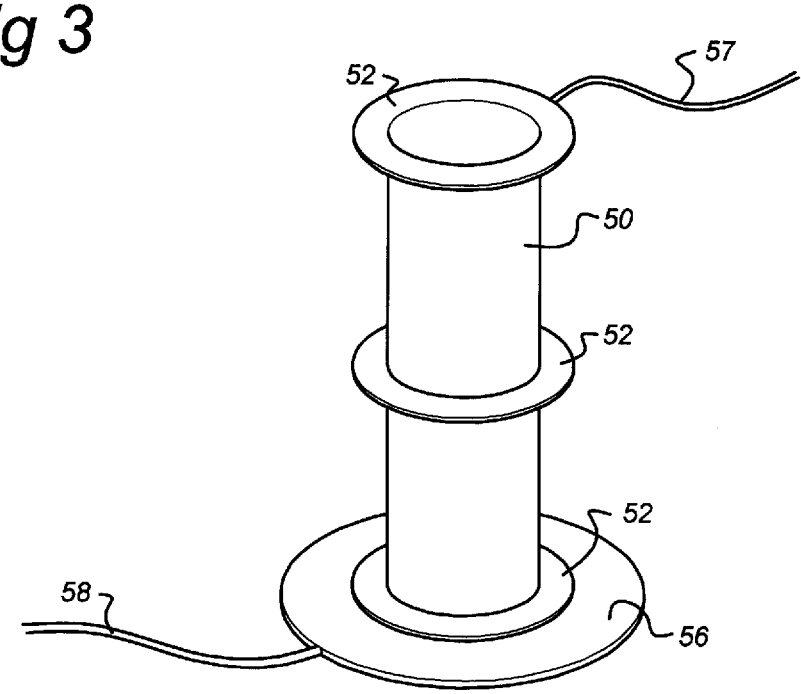
FIG. 3 is an example of a through-hole via.
Figure 8:
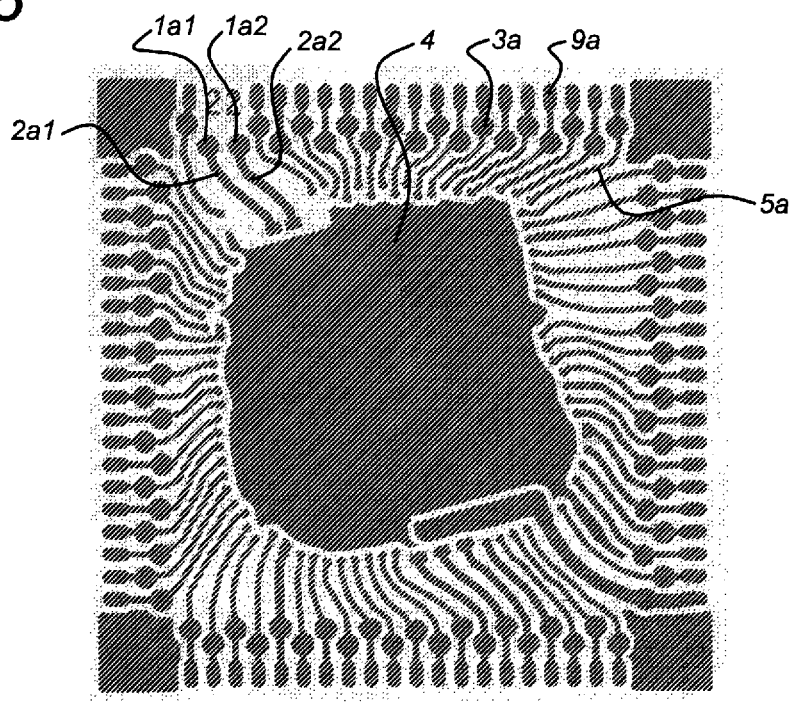
FIG. 8 shows a first layer of a package according to the present disclosure.

As shown in the drawing of FIG. 8, the first layer of the package comprises two through-hole vias $1a1$ and $1a2$ on the upper-left part of FIG. 8. The through-hole vias $1a1$, $1a2$ are connected to two short transmission lines $2a1$ and $2a2$, respectively. The first layer comprises a big die attachment area 4 in the center where, in use, the chip (not shown in FIG. 8) is attached. Moreover, the first layer comprises a plurality of pads $9a$ consecutively located on the edge of FIG. 8, a plurality of through-hole vias $3a$ consecutively located close to said pads $9a$, and a plurality of conducting leads $5a$. Each lead $5a$ connects to both one pad $9a$ and one through-hole via $3a$. Wire bonds 26 (depicted in FIG. 1) may be used to connect stubs $2a1$, $2a2$ and the die attached above said attachment area 4.

Figure 9:
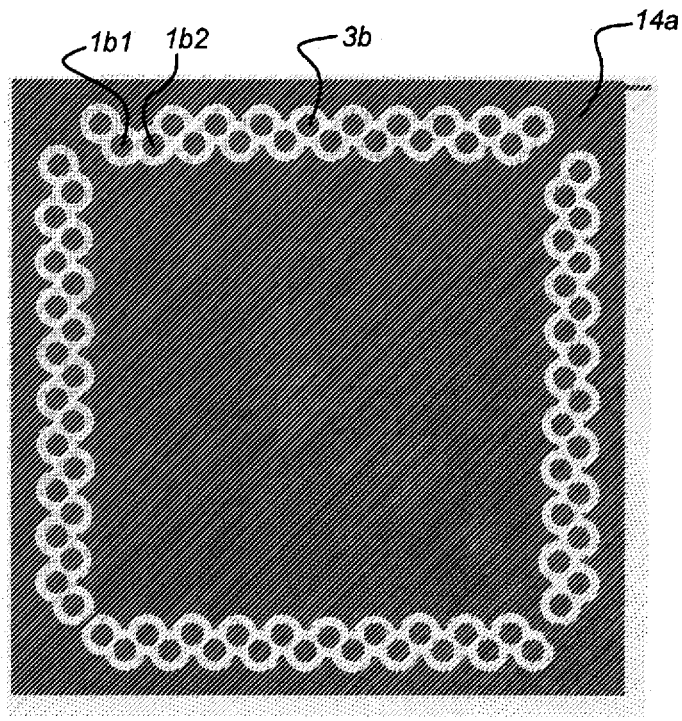
FIG. 9 shows a second layer of a package according to the present disclosure.

As shown in the drawing of FIG. 9, the second layer of the package comprises two through-hole vias $1b1$ and $1b2$ on the left part of FIG. 9. The through-hole vias $1b1$ and $1b2$ have exactly the same dimensions as the through-hole vias $1a1$, $1a2$ in the first layer, and when the first layer is located on top of the second layer the through-hole vias $1a1$, $1a2$ are exactly located above (aligned with) the through-hole vias $1b1$, $1b2$, respectively. Moreover, the second layer comprises a ground structure $14a$ which covers most of the remaining area of the second layer apart from a plurality of through-hole vias $3b$. These through-hole vias $3b$ have the same dimensions as through-hole vias $3a$ in the first layer (see FIG. 8) and will be aligned with through-hole vias $3a$ when the second layer is located on top of the first layer.

Figure 10:
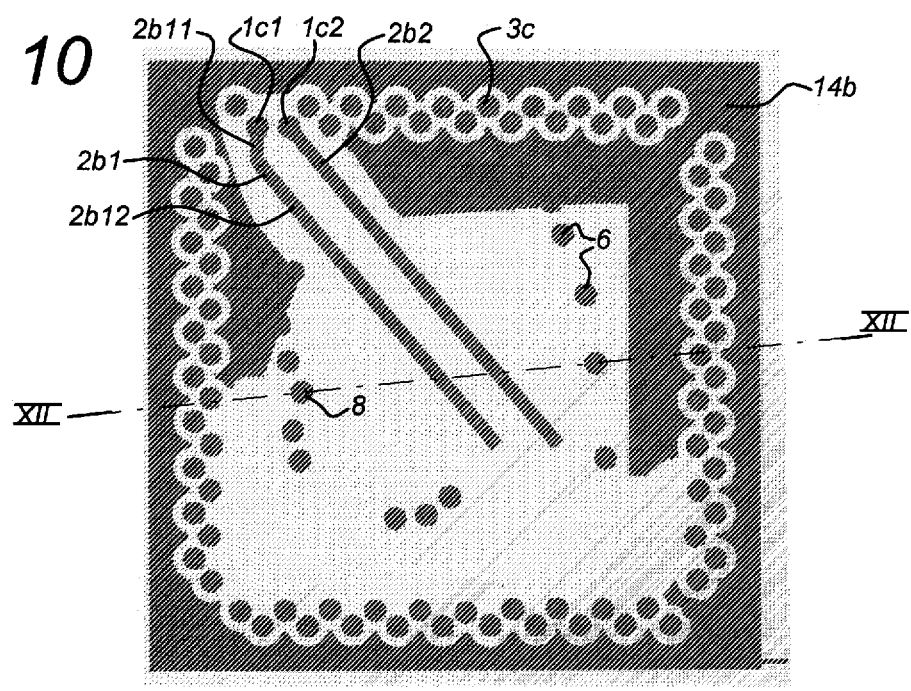
FIG. 10 shows a third layer of a package according to the present disclosure.

As shown in the drawing of FIG. 10, the third layer of the package comprises a pair of stubs $2b1$ and $2b2$. The stub $2b1$ comprises a long portion $2b12$ and a short portion $2b11$. The long portion $2b12$ and the stub $2b2$ are located on a central, non-conductive area of the third layer. The lengths of the stubs $2b1$ and $2b2$ are substantially the same. The lengths of the stubs $2b1$ and $2b2$ equal one fourth of the wavelength $\lambda$ ($\lambda/4$) of the signal transmitted from the die to the balun circuit 74 in order to short the unwanted second harmonic components of this signal as mentioned before. Also the $6^{th}$, $10^{th}$, etc. harmonic components may be shorted in this way as explained with reference to FIG. 7.

The third layer comprises two through-hole vias $1c1$, $1c2$. The through-hole vias $1c1$, $1c2$ have such dimensions and are arranged on such locations that they will be aligned with through-hole vias $1a1$ and $1a2$, $1b1$ and $1b2$, respectively, when the first and second layers are located on top of the third layer. The short portion $2b11$ of stub $2b1$ is connected to the through-hole via $1c1$ and the stub $2b2$ is connected to the through-hole via $1c2$. Moreover, the third layer comprises a plurality of through-hole vias 6, 8 which are located on the edge of the central, non-conductive area of the third layer. The third layer also has a plurality of through-hole vias $3c$ which are dimensioned and located to be aligned with through-hole vias $3b$ on the second layer when the first and second layers are located on top of the third layer.

Both said stubs $2b1$ and $2b2$, and said vias 6, 8 are located inside of the same area as die attachment area 4 depicted in FIG. 8.

Figure 11:
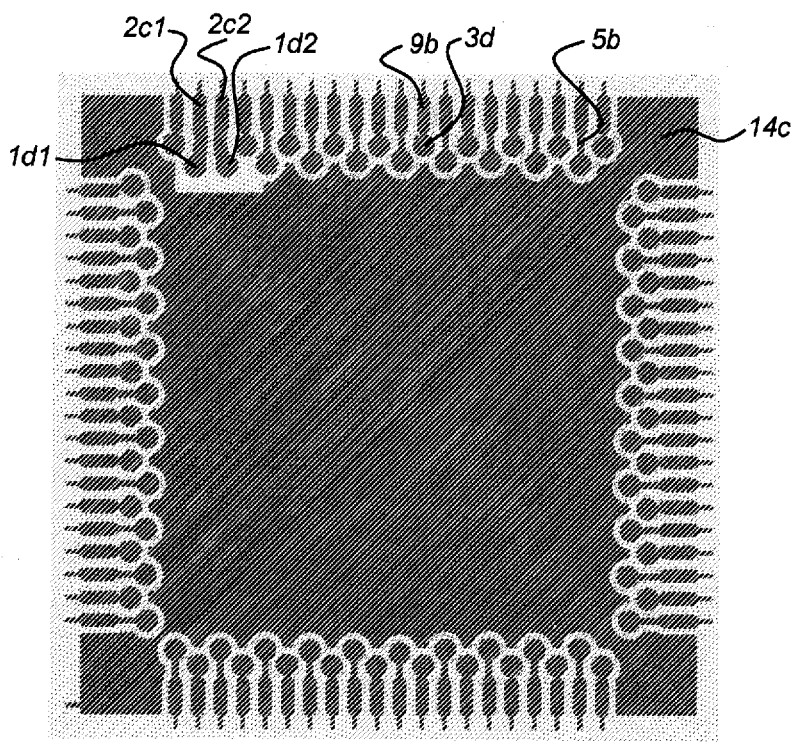
FIG. 11 shows a fourth layer of a package according to the present disclosure.

As shown in the drawing of FIG. 11, the fourth layer of the package comprises two conductive pads $1d1$ and $1d2$ on the upper-left part of the figure. The conductive pads $1d1$ and $1d2$, respectively, are located and arranged such that, when the first, second and third layers are located on top of the fourth layer, they connect to the through-hole vias $1c1$ and $1c2$, respectively. They are also connected to two short transmission lines $2c1$ and $2c2$, respectively, on the fourth layer that, on their other sides, are connected to suitable pads on the edge of the fourth layer. The two short transmission lines $2c1$ and $2c2$ are arranged such that, when the first, second and third layers are located on top of the fourth layer, they are aligned with the short transmission lines $2a1$ and $2a2$, respectively.

The fourth layer comprises a plurality of conductive pads $3d$ that are located such that they are aligned with and connected to through-hole vias $3c$ in the third layer when the first, second and third layers are located on top of the fourth layer. The pads $3d$ are connected to suitable conductive leads $5b$ on the fourth layer that connect to a suitable pads $9b$ at the edge of the fourth layer. The fourth layer comprises a ground structure area $14c$ that substantially covers the remaining part of the area of the fourth layer. When the first, second and third layers are located on top of the fourth layer, the through-hole vias 6 in the third layer connect to the ground structure area $14c$.

Figure 12:
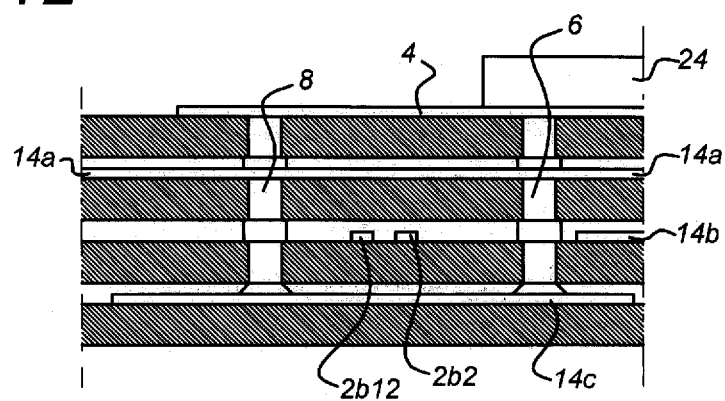
FIG. 12 shows a cross section diagram of a package according to the present disclosure.

The thawing of FIG. 12 shows how the four layers are located relative to one another when they are located on top of one another. FIG. 12 is a cross section along line XII-XII indicated in FIG. 10.

By this arrangement, stub $2b1$, together with transmission lines $2a1$ and $2c1$ act as one unified structure. Moreover, stub $2b2$, together with transmission lines $2a2$ and $2c2$, act as another unified structure. Both unified structures together provide the output of the die with the same impedance value as the pre-match circuit 72 that is depicted in FIG. 5.

The through-hole vias 6, 8 penetrate the package from the die attachment area 4 on the first layer to the fourth layer and are arranged to connect to the ground structure $14a$ on the second layer and to the ground structure $14c$ on the fourth layer. The aim of the through-hole via 6 is to electrically connect the die attachment area 4 to the ground structures $14a$, and $14c$. Moreover, ground structure $14b$ is grounded to one or more suitable via through holes (not shown). The distances between the ground structures $14a$, $14b$ and $14c$, respectively, and the two unified structures are well defined. So, both unified structures together have a capacity against these ground structures 14a, 14b and 14c which is well defined and can be estimated very well in advance.

A second embodiment of the package relates to a substrate of three-layers and will be explained with reference to FIGS. 8, 10, 11, and 13.

In the second embodiment of the package, the first layer is the same as the first layer of the first embodiment depicted in FIG. 8. The second layer of the second embodiment is the same as the third layer of the first embodiment depicted in FIG. 10. The third layer of the second embodiment is the same as the fourth layer of the first embodiment depicted in FIG. 11.

Figure 13:
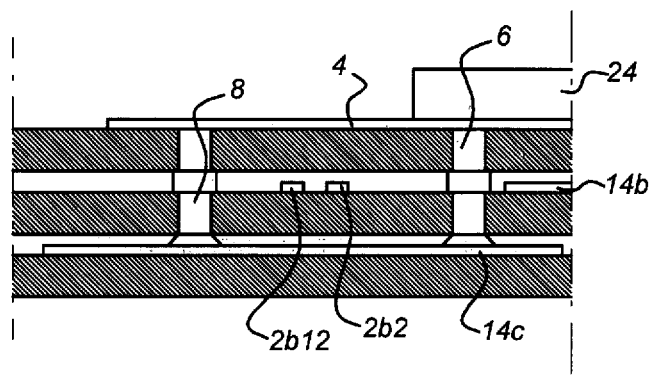
FIG. 13 shows a cross section diagram of a package according to the present disclosure.

The drawing of FIG. 13 shows how, in the second embodiment, the three layers are located relative to one another when they are located on top of one another. FIG. 13 is a cross section along line XII-XII indicated in FIG. 10 for the second embodiment.

By this arrangement, stub 2b1, together with transmission lines 2a1 and 2c1 act as one unified structure. Moreover, stub 2b2, together with transmission lines 2a2 and 2c2, act as another unified structure. Both unified structures together provide the output of the die with the same impedance value as the pre-match circuit 72 that is depicted in FIG. 5.

The through-hole vias 6, 8 now penetrate the package from die attachment area 4 on the first layer to the second and third layer and are arranged to connect die attachment area 4 on the first layer to the ground structure 14c on the third layer. The aim of the through-hole via 6 is to electrically connect die attachment area 4 on the first layer to the ground structure 14c. Moreover, ground structure 14b is grounded to one or more suitable via through holes (not shown). The distances between the first layer and the ground structures 14b and 14c, respectively, and the two unified structures are well defined. So, both unified structures together have a capacity against die attachment area 4 on the first layer and the ground structures 14b and 14c which are well defined and can be estimated very well in advance.

A third embodiment of the package relates to a substrate of three-layers and will be explained with reference to FIGS. 8, 9, 10 and 14.

In the third embodiment of the package, the first layer is the same as the first layer of the first embodiment depicted in FIG. 8. The second layer of the third embodiment is same as the second layer of the first embodiment depicted in FIG. 9. The third layer of the third embodiment is same as the third layer of the first embodiment depicted in FIG. 10.

Figure 14:
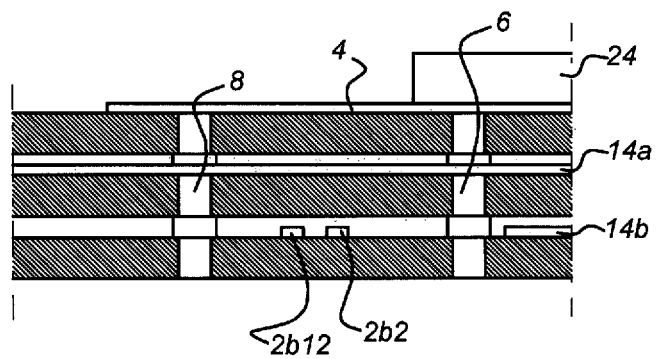
FIG. 14 shows a cross section diagram of a package according to the present disclosure.

The drawing of FIG. 14 shows how the three layers are located relative to one another when they are located on top of one another. FIG. 14 is a cross section along line XII-XII indicated in FIG. 10 for the third embodiment.

By this arrangement, transmission line 2a1 and stub 2b1 act as one unified structure. Moreover, transmission line 2a2 and stub 2b2 act as another unified structure. Both unified structures together provide the output of the die with the same impedance value as the pre-match circuit 72 that is depicted in FIG. 5.

The through-holes via 6, 8 penetrate the package from the die attachment area 4 on the first layer to the ground structure 14a to the bottom side of the third layer and are arranged to connect the first layer to the bottom of the third layer. The aim of the through-hole vias 6, 8 is to electrically connect the die attachment area 4 to the ground structure 14a and to the bottom of the third layer where it can be connected to a ground layer on the PCB. Moreover, ground structure 14b is grounded to one or more suitable via through holes (not shown). The distances between the ground structures 14a, 14b and the ground layer on PCB below the third layer, respectively, and the two unified structures are well defined. So, both unified structures together have a capacity against the ground structures 14a, 14b and the ground layer on the PCB which are well defined and can be estimated very well in advance.

A fourth embodiment of the package relates to a substrate of two-layers and will be explained with reference to FIGS. 8, 10 and 15.

In the fourth embodiment of the package, the first layer is the same as the first layer of the first embodiment depicted in FIG. 8. The second layer of the fourth embodiment is the same as the third layer of the first embodiment depicted in FIG. 10.

Figure 15:
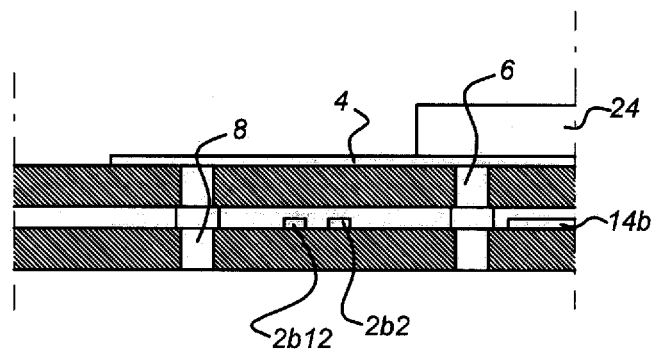
FIG. 15 shows a cross section diagram of a package according to the present disclosure.

The drawing of FIG. 15 shows how the two layers are located relative to one another when they are located on top of one another. FIG. 15 is a cross section along line XI-XI indicated in FIG. 10 for the fourth embodiment.

By this arrangement, transmission line 2a1 and stub 2b1 act as one unified structure. Moreover, transmission line 2a2 and stub 2b2 act as another unified structure. Both unified structures together provide the output of the die with the same impedance value as the pre-match circuit 72 that is depicted in FIG. 5.

The through-hole vias 6, 8 are arranged to electrically connect the die attachment layer 4 to a ground layer on the PCB such that they are both grounded. Moreover, ground structure 14b is grounded to one or more suitable via through holes (not shown). The distances between the die attachment layer 4 and ground layer on PCB, respectively, and the two unified structures are well defined. So, both unified structures together have a capacity against the die attachment area 4, the ground structure 14b and the ground layer on the PCB which are well defined and can be estimated very well in advance.

Figure 4:
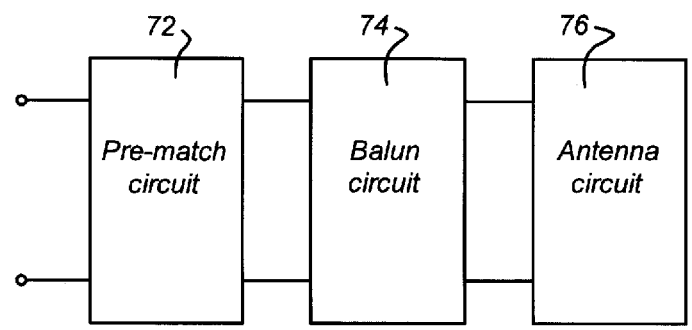
FIG. 4 shows a block diagram of a pre-match circuit and balun circuit.

A fifth embodiment of the package relates to a substrate of four-layers and will be explained with reference to FIGS. 8, 9, 11, 16, and 17. It is observed that this embodiment is not restricted to substrates with four layers. As a standard package, all four layers have the same dimension. As will be explained below, the four-layer package contains one or more stubs and a plurality of through-hole vias which together provide the same impedance as a pre-match circuit as shown in FIG. 4, i.e. the pre-match circuit 72 is moved into the package. The balun circuit 74 remains external (on main PCB).

In the fifth embodiment, the first layer is the same as the first layer of the first embodiment depicted in FIG. 8. The second layer of the fifth embodiment is the same as the second layer of the first embodiment depicted in FIG. 9. The fourth layer of the fifth embodiment is the same as the fourth layer of the first embodiment depicted in FIG. 11.

Figure 16:
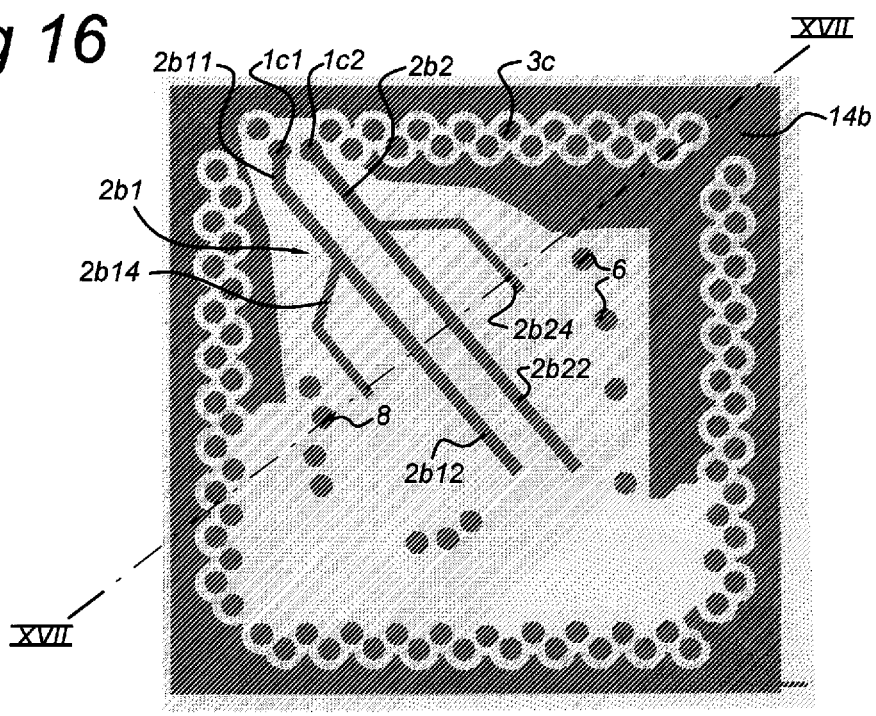
FIG. 16 shows a third layer of a package according to the present disclosure.

FIG. 16 shows the third layer of the fifth embodiment. As shown in the drawing of FIG. 16, the third layer of the package comprises a pair of stubs 2b1 and 2b2. The stub 2b1 comprises a long portion 2b12, a short portion 2b11, and an extended portion 2b14 extending from the long portion 2b12. The stub 2b2 comprises a long portion 2b22, and an extended portion 2b24 extending from long portion 2b22. The stubs 2b1 and 2b2 are located on a central, non-conductive area of the third layer, respectively. The length of the long portion 2b22 equals the length of the short portion 2b11 together with long portion 2b12 of stub 2b1 which is one fourth of the wave length $\lambda(\lambda/4)$.

The lengths of extended portions 2b14 of stub 2b1 and 2b24 of stub 2b2 are substantially the same. Their lengths are selected such as to short a certain further predetermined harmonic component of the signal. For instance, the lengths of 2b11+2b12 and of 2b22 are chosen so as to form a short for the second harmonic frequency at the location of vias 1c1 and 1c2, as explained above. The extended portions 2b14 and 2b24 have respective lengths that are selected such that together with the lengths of the portions of stubs 2b1 and 2b2, respectively connecting the extending portions 2b14 and 2b24, respectively, to vias 1c1 and 1c2, respectively, form a short for the fourth (or other higher) harmonic at the locations of the vias 1c1 and 1c2.

Available parameters for achieving both goals of providing a desired capacity for the pre-match circuit and of providing a short circuit for one or more higher harmonics are the length and width of 2b1 and 2b2, and, if present, of 2b14 and 2b24, respectively. Also the mutual couplings, i.e. mutual distances, between the different stubs 2b1/2b2, 2b12/2b22 and between the stubs and the extended portions, so 2b14/2b12, 2b24/2b22 and between the stubs and extended portions and the ground planes (could be ground planes 14a, 14b or 14c or any combination thereof) can be used as a design parameter. For instance, extended portions 2b14 and 2b24 can be arranged such that they are substantially at an angle of 90° to each other and 45° to stubs 2b1 and 2b2, such that their mutual coupling to the stubs is negligible.

All the other features of layer three of the fifth embodiment as shown in FIG. 16 are the same as those of the third layer shown in FIG. 10.

Figure 17:
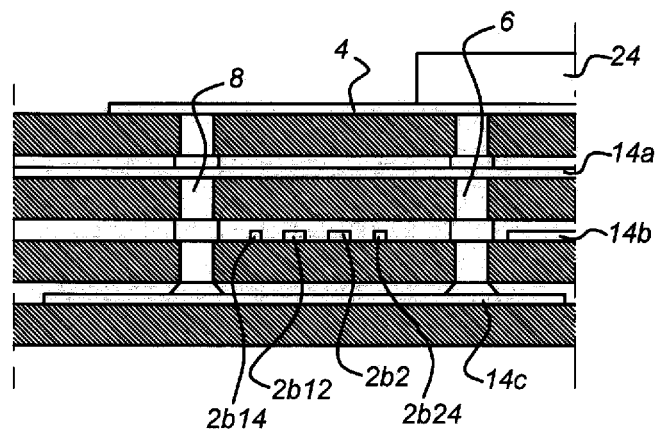
FIG. 17 shows a cross section diagram of a package according to the present disclosure.

The drawing of FIG. 17 shows how the four layers are located relative to one another when they are located on top of one another. FIG. 17 is a cross section along line XVII-XVII indicated in FIG. 16. The cross section is essentially the same as the one shown in FIG. 12, apart from the extended portions 2b14 and 2b24, respectively, on the third layer.

A sixth embodiment of the new package relates to a substrate of four-layers and will be explained with reference to FIGS. 18-22. It is observed that this embodiment is not restricted to substrates with four layers. This package may use Surface Mount Technology (SMT) or wire bond attachment technology. As a standard package, all four layers have the same dimension. As will be explained below, the four-layer package contains one or more stubs and a plurality of through-hole vias which together provide the same impedance as a pre-match circuit 72 as shown in FIG. 5, i.e. the pre-match circuit 72 is moved into the package. The balun circuit 74 remains external to the package but on the main PCB.

Figure 18:
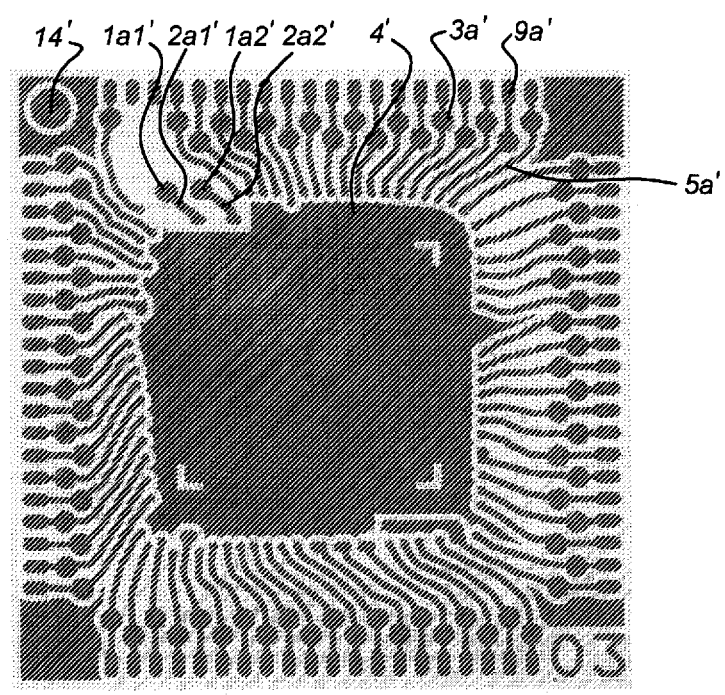
FIG. 18 shows a first layer of a package according to the present disclosure.

As shown in the drawing of FIG. 18, the first layer of the package comprises two through-hole vias 1a1' and 1a2' on the upper-left part of FIG. 18. These through-hole vias 1a1', 1a2' are connected to two short transmission lines 2a1' and 2a2', respectively. The first layer comprises a big die attachment area 4' in the center where the chip (not shown in FIG. 18) is attached. Moreover, the first layer comprises a plurality of pads 9a' consecutively located on the edges of FIG. 18, a plurality of through-hole vias 3a' consecutively located close to said pads 9a', a pad 14' in the form of a circle located on the upper-left of FIG. 18 which is used as a ground structure and connects to other ground structures (14a', 14b', 14c') on other layers by a through-hole via (not shown), and a plurality of conducting leads 5a'. Each lead 5a' connects to both one pad 9a' and one through-hole via 3a'. Two wire bonds 16 (depicted in FIG. 22) are provided which connect to both said stubs 2a1' and 2a2' and the die attached above said attachment area 4'.

Figure 19:
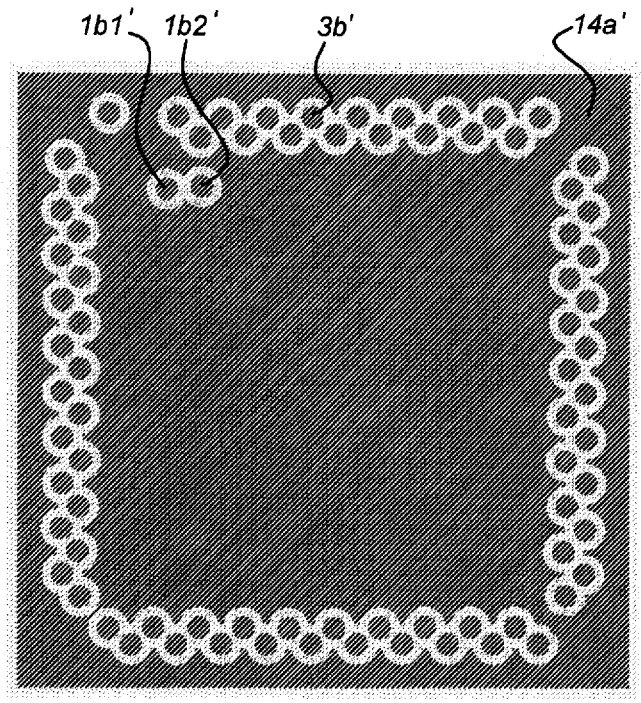
FIG. 19 shows a second layer of a package according to the present disclosure.

As shown in the drawing of FIG. 19, the second layer of the package comprises two through-hole vias 1b1' and 1b2'. These two through-hole vias 1b1' and 1b2' have exactly the same dimensions as the two through-holes 1a1', 1a2' in the first layer, and when the first layer is located on top of the second layer, the through-holes 1a1', 1a2' are exactly located above 1b1', 1b2', respectively. Moreover, the second layer comprises a ground structure 14a' which covers most of the remaining area of the second layer apart from a plurality of through-holes 3b'. These through-holes 3b' have the same dimensions as through-holes 3a' in the first layer (see FIG. 18) and will be aligned with through-holes 3a' when the second layer is located on top of the first layer.

Figure 20:
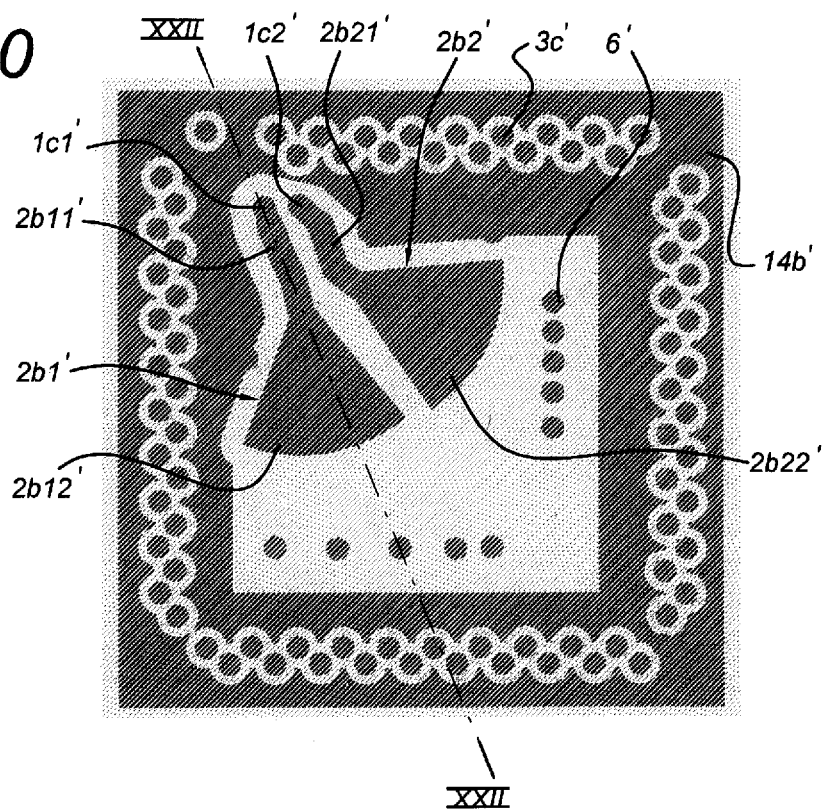
FIG. 20 shows a third layer of a package according to the present disclosure.

As shown in the drawing of FIG. 20, the third layer of the package comprises two stubs 2b1' and 2b2'. Each of these stubs 2b1' and 2b2', respectively, comprise a short bar shaped area, 2b11' and 2b21', respectively. These bar shaped areas 2b11' and 2b21' may be aligned with the locations of stubs 2a1' and 2a2', respectively, on the first layer depicted in FIG. 18. The stubs 2b1' and 2b2', respectively, also comprise fan-shaped areas 2b12' and 2b22', respectively, which may be as large as one eighth of a circle area with a diameter of approximately 7 mm. The third layer comprises two through-hole vias 1c1' and 1c2' which have such dimensions and are arranged on such locations that they will be aligned with through-holes 1a1' and 1a2', 1b1' and 1b2', respectively, when the first and second layers are located on top of the third layer. Moreover, the third layer comprises a plurality of through-hole vias 6' which are symmetrically located on the edge of a central, non-conductive area of the third layer. The third layer also has a plurality of through-hole vias 3c' which are dimensioned and located to be aligned with through-hole vias 3b' on the second layer when the first and second layer are located on top of the third layer. Both said stubs 2b1' and 2b2', and said vias 6 are located inside of the same area as die attachment area 4' depicted in FIG. 18. The third layer also comprises a ground structure 14b' which is located on the edge of FIG. 20.

Figure 21:
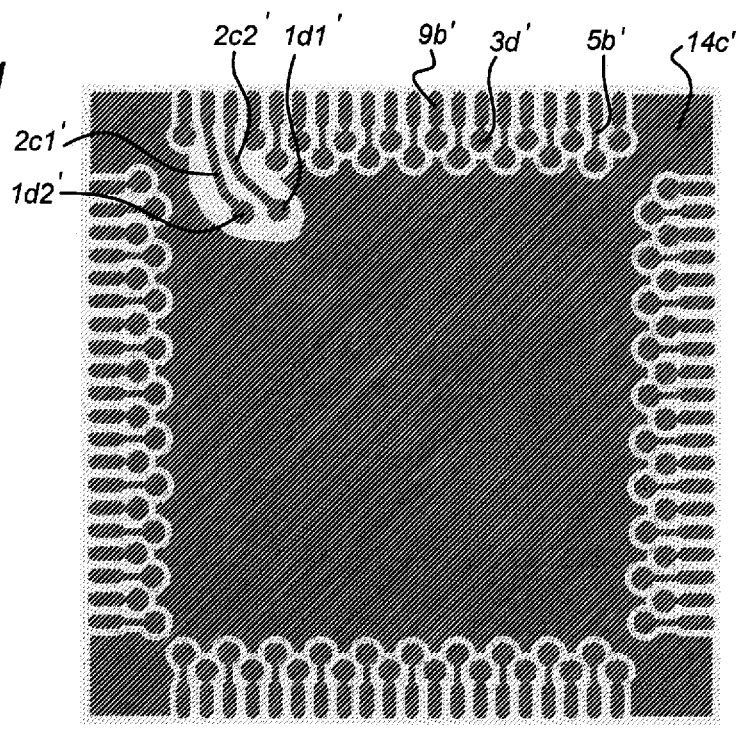
FIG. 21 shows a fourth layer of a package according to the present disclosure.

As shown in the drawing of FIG. 21, the fourth layer of the package comprises two conductive pads 1d1' and 1d2' on the upper-left part of the figure. The conductive pads 1d1' and 1d2', respectively are located and arranged such that, when the first, second and third layers are located on top of the fourth layer, they connect to the through-hole vias 1c1' and 1c2', respectively. They are also connected to two short transmission lines 2c1' and 2c2', respectively, on the fourth layer that, on their other sides, are connected to suitable pads on the edge of the fourth layer. The two short transmission lines 2c1' and 2c2' are arranged such that, when the first, second and third layers are located on top of the fourth layer, they are aligned with the short transmission lines 1a1' and 1a2', respectively. The fourth layer comprises a plurality of conductive pads 3d' that are located such that they are aligned with and connected to through-holes 3c' in the third layer when the first, second and third layer are located on top of the fourth layer. The pads 3d' are connected to suitable conductive leads 5b' on the fourth layer that connect to suitable pads 9b' at the edge of the fourth layer. The fourth layer comprises a ground structure area 14c' that substantially covers the remaining part of the area of the fourth layer. When the first, second and third layers are located on top of the fourth layer, the through-hole vias 6' in the third layer connect to the ground structure area 14c'.

Figure 22:
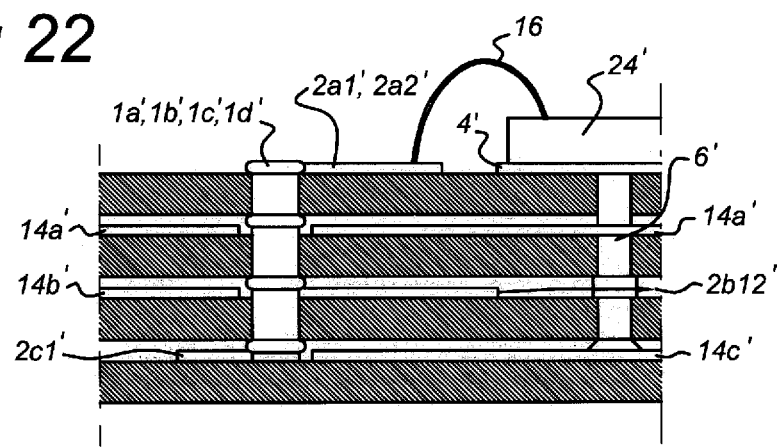
FIG. 22 shows a cross section diagram of a package according to the present disclosure.

The drawing of FIG. 22 shows how the four layers are located relative to one another when they are located on top of one another. FIG. 22 is a cross section along line XXII-XXII indicated in FIG. 20.

As shown in the drawing of FIG. 22, the through-hole vias 1a1', 1b1', 1c1' penetrate across the upper three layers where the first layer is the top layer and the fourth layer is the bottom layer. The last through-hole via 1c1' connects to pad 1d1' on the fourth layer. The through-hole vias 1a1', 1c1', 1d1', respectively, are attached to transmission line 2a1', stub 2b1' and transmission line 2c1', respectively.

The through-hole vias 1a2', 1b2', 1c2' also penetrate across the upper three layers. The last through-hole via 1c2' connects to pad 1d2' on the fourth layer. The through-hole vias 1a2', 1c2', 1d2', respectively, are attached to transmission line 2a2', stub 2b2', and transmission line 2c2', respectively.

By this arrangement, stubs 2b1', transmission lines 2a1' and 2c1' act as one unified structure. Moreover, stubs 2b2', transmission lines 2a2' and 2c2' act as another unified structure. Both unified structures together provide the output of the die with the same impedance value as the pre-match circuit 72 that is depicted in FIG. 5.

The through-hole via 6' penetrates the PCB from the first layer to the fourth layer and is arranged to electrically connect together the ground structures 4' on the first layer, 14a' on the second layer, and 14c' on the fourth layer and also to make the ground connection to the PCB on which the package is mounted. The distances between the ground structures 14', 14a', 14b' and 14c', respectively, and the fan shaped stubs 2b12', 2b22' are well defined. So, the two unified structures together have a capacity against these ground structures 14', 14a', 14b' and 14c' which is well defined and can be estimated very well in advance. The stubs themselves are not connected to ground. The stubs are so-called open-circuited transmission lines. Depending on the frequency, the input of an open-circuited transmission lines varies (see FIG. 7). The line length of the stub is tuned such that the input impedance is a short to ground at the second harmonic (this will be pi/2 in FIG. 7 where Bin reaches infinite). At lower frequencies the input impedance of this open-circuited transmission line behaves as a capacitance to ground (this will be the region <pi/2 in FIG. 7). This will provide the impedance match.

Moreover, when two such ground structures are provided on opposing sides of the fan-shaped stubs 2b12', 2b22' they provide a cage of Faraday to the stubs, thus protecting from external electromagnetic radiation. Furthermore, in all the arrangements with stubs (FIGS. 10, 16 and 20) the ground structures that are provided on opposing sides of the stubs create a kind of Faraday cage. This not only protects the inner structure of the package from external electromagnetic radiation, but it also prohibits electromagnetic radiation from the stubs to be emitted to the outside of the package.

The fan shaped structure can be combined with any one of the embodiments of the FIGS. 8-17.

What is claimed is:

1. A package having an integrated pre-match circuit, comprising:
 a connection at a first side of said package to a printed circuit board;
 a die fixed to said package on a second side opposite to said first side; and
 said integrated pre-match circuit constituting an impedance match for a signal sent to a circuit external to said package, wherein said signal has a predetermined main frequency component, said pre-match circuit comprising:
 a pair of transmission lines; and
 a first pair of stubs arranged on a predetermined layer of said package and connected to said pair of transmission lines, wherein said first pair of stubs have a length such as to substantially form a short circuit for at least an harmonic frequency of said predetermined main frequency component in said signal, wherein said harmonic frequency is higher than said predetermined main frequency component, wherein each stub of said first pair of stubs has a fan shape and wherein said package comprises a first ground layer on top of said predetermined layer and a second ground layer below said predetermined layer.

2. The package according to claim 1, wherein said harmonic frequency is the second harmonic frequency of said predetermined main frequency.

3. The package according to claim 2, wherein said pre-match circuit further comprises at least a second pair of stubs having dimensions such as to substantially form a short circuit for at least one other harmonic frequency of said predetermined main frequency component in said signal, wherein said other harmonic frequency is higher than said second harmonic frequency.

4. The package according to claim 1, wherein said harmonic frequency is the second harmonic frequency of said predetermined main frequency.

5. The package according to claim 1, wherein said first and second ground layers provide a cage of Faraday to said first pair of stubs, thus protecting from external electromagnetic radiation.

6. The package according to claim 4, wherein said pre-match circuit further comprises at least a second pair of stubs having dimensions such as to substantially form a short circuit for at least one other harmonic frequency of said predetermined main frequency component in said signal, wherein said other harmonic frequency is higher than said second harmonic frequency.

7. The package according to claim 6 wherein said first and second ground layers provide a cage of Faraday to said first pair of stubs and said second pair of stubs, thus protecting from external electromagnetic radiation.

8. The package according to claim 1, further comprising a circuit attached to said printed circuit board, wherein said circuit is electrically connected to said pre-match circuit integrated in said package.

9. The package according to claim 8, wherein said circuit is a balun circuit.

10. The package according to claim 8, wherein said pre-match circuit further comprises at least a second pair of stubs having dimensions such as to substantially form a short circuit for at least one other harmonic frequency of said predetermined main frequency component in said signal, wherein said other harmonic frequency is higher than said second harmonic frequency.

* * * * *